United States Patent [19]

Fassel et al.

[11] Patent Number: 5,394,301
[45] Date of Patent: Feb. 28, 1995

[54] ARRANGEMENT FOR DISSIPATING HEAT FROM POWER COMPONENTS ASSEMBLED ON A PRINTED-CIRCUIT BOARD

[75] Inventors: Reinhard Fassel, Oberasbach; Herbert Klinger, Nuernberg; Hartmut Zoebl, Fuerth, all of Germany

[73] Assignee: Robert Bosch GmbH, Stuttgart, Germany

[21] Appl. No.: 189,009

[22] Filed: Jan. 28, 1994

[30] Foreign Application Priority Data

Feb. 3, 1993 [DE] Germany .............................. 4302917

[51] Int. Cl.[6] ............................................. H05K 7/20
[52] U.S. Cl. ..................................... 361/720; 174/252
[58] Field of Search ...................... 165/80.3, 185; 174/16.3, 252; 361/688, 690, 704–713, 720, 721

[56] References Cited

U.S. PATENT DOCUMENTS

| 4,628,407 | 12/1986 | August et al. | 361/707 |
| 4,941,067 | 7/1990 | Craft | 361/707 |
| 4,945,451 | 7/1990 | Gahl et al. | 361/720 |
| 5,012,387 | 4/1991 | Ohlenburger | 361/708 |

FOREIGN PATENT DOCUMENTS

| 0330167 | 8/1984 | Germany | 361/705 |

*Primary Examiner*—Gregory D. Thompson
*Attorney, Agent, or Firm*—Kenyon & Kenyon

[57] ABSTRACT

An arrangement for dissipating heat from power components assembled on a printed-circuit board dissipates heat generated in the power components to the side of the printed-circuit board that is removed from the components. The printed-circuit board may have heat-transfer bore holes, and a heat-conducting material applied in the area of the power components, the heat-transfer bore holes, and the side of the printed-circuit board facing away from the power components. The side of the printed-circuit board that is removed from the power components may be coated with an insulating enamel and with a flexible heat-conducting enamel.

16 Claims, 1 Drawing Sheet

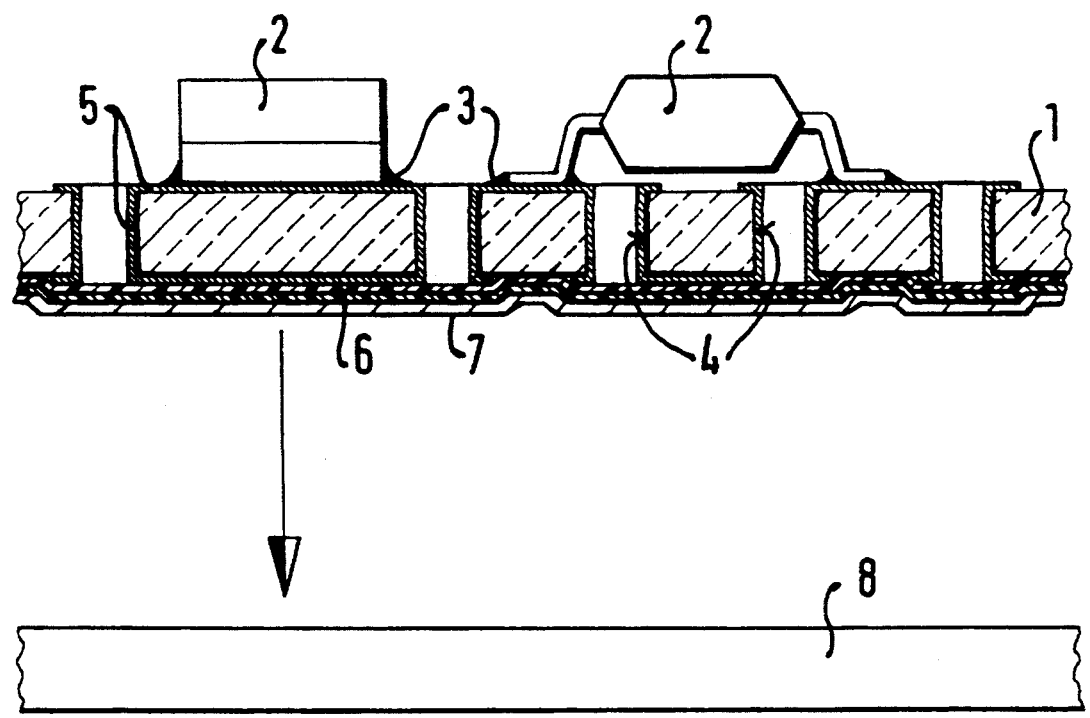

ARRANGEMENT FOR DISSIPATING HEAT FROM POWER COMPONENTS ASSEMBLED ON A PRINTED-CIRCUIT BOARD

FIELD OF THE INVENTION

The present invention relates to an arrangement for dissipating heat from power components assembled on printed-circuit boards.

BACKGROUND INFORMATION

It is known in the art to place power components on heat sinks which are subsequently bonded to a printed-circuit board in order to dissipate heat. Furthermore, it is known to bond power components to a printed-circuit board and dissipate heat through the back of the printed-circuit board, for example, by using cooling plates and heat sinks. However, such methods cannot guarantee an adequate heat transfer to the back of the printed-circuit board and a proper electrical insulation. Furthermore, irregularities can occur when insulating foil is applied to the back of the printed-circuit board so that there is no flat connection to a heat sink or to a cooling plate.

SUMMARY OF THE INVENTION

The arrangement according to the present invention is advantageous because the dissipation of heat from the power component to the side of the printed-circuit board facing away from the power component is particularly good due to the use of heat-dissipating material, such as copper, to achieve improved heat conduction. An additional advantage is realized by applying an insulating enamel to the back of the printed-circuit board so that no tin-lead solder can flow when the components are applied to the back of the printed-circuit board, since the insulating enamel also seals off the openings of the heat-transfer bore holes distributed over the printed-circuit board. Another advantage of the claimed invention is that the application of a flexible, heat-conducting enamel layer to the insulating enamel compensates for any unevenness that possibly occurs when power components are assembled onto a printed-circuit board. Moreover, application of a flexible, heat-conducting enamel layer to the insulating enamel allows for a flat connection between the printed-circuit board and the cooling plate.

A further advantage of the arrangement according to the present invention is that any thickness at all can be selected for the heat-conducting flexible enamel layer, depending upon the size of the irregularities on the printed-circuit board. For this purpose, several enamel layers can be applied, in some instances one after another, until the printed-circuit board has been affixed flatly to the cooling plate.

BRIEF DESCRIPTION OF THE DRAWING

The Figure shows an arrangement for dissipating heat from power components assembled on printed-circuit boards in accordance with the present invention.

DETAILED DESCRIPTION

The Figure illustrates a printed-circuit board 1 having power components 2 affixed to it. The power components may be SMD components. The power components 2 are suitably bonded to the printed-circuit board by means of tin-lead solder 3. The printed-circuit board 1 has heat-transfer bore holes 4, which are distributed over the printed-circuit board and serve to dissipate heat to the side of the printed-circuit board removed from the power components.

To achieve improved heat conduction, a heat-conducting material 5, such as copper, is provided. The heat-conducting material is applied to the side of the printed-circuit board 1 facing the power components in the area of the power components, at the inner walls of the heat-transfer bore holes 4 and on the side of the printed-circuit board 1 facing away from the power components.

The back side of the printed-circuit board, thus the side of the printed-circuit board 1 facing away from the power components 2, is coated with an insulating enamel 6. This insulating enamel 6 (it also being conceivable to apply an insulating film) is applied to the back side of the printed-circuit board 1 so as to seal off the heat-transfer bore holes.

At this point, a flexible, heat-dissipating enamel layer 7 is applied to the insulating enamel, this insulating layer being flexible and soft, thus providing a better compensation for any irregularities which could occur on the printed-circuit board 1. Several layers of the flexible insulating enamel 7 could be applied to compensate for irregularities which occur, for example, during soldering, in the form of cambers, or during etching, as the result of unevenness in the copper layer. The arrangement subsequently can be assembled flatly on a cooling plate 8.

What is claimed is:

1. An arrangement for dissipating heat from power components assembled on a printed-circuit board, comprising:
   a) a printed-circuit board having a plurality of heat transfer bore holes distributed therethrough, the bore holes defining inner walls, and the printed-circuit board having a first side for assembling power components thereon and a second side facing away from the power components;
   b) a heat-conducting material applied on the first side of the printed circuit board in the area of the power components, on the inner walls of the bore holes, and on the second side of the printed-circuit board;
   c) an insulating enamel coating applied on the heat-conducting material on the second side of the printed-circuit board; and
   d) a flexible heat-conducting enamel layer applied to the insulating enamel coating.

2. The arrangement as set forth in claim 1, wherein the heat-conducting material includes copper.

3. The arrangement as set forth in claim 1, wherein at least one additional flexible heat-conducting enamel layer is applied to the insulating enamel coating.

4. The arrangement as set forth in claim 2, wherein at least one additional flexible heat-conducting enamel layer is applied to the insulating enamel coating.

5. The arrangement as set forth in claim 1, wherein the insulating enamel coating completely covers and seals off the heat transfer bore holes.

6. The arrangement as set forth in claim 2, wherein the insulating enamel coating completely covers and seals off the heat transfer bore holes.

7. The arrangement as set forth in claim 1, further comprising a cooling plate, flatly affixed to the flexible heat-conducting enamel layer.

8. The arrangement as set forth in claim 2, further comprising a cooling plate, flatly affixed to the flexible heat-conducting enamel layer.

9. The arrangement as set forth in claim 3, further comprising a cooling plate, flatly affixed to the flexible heat-conducting enamel layer.

10. The arrangement as set forth in claim 4, further comprising a cooling plate, flatly affixed to the flexible heat-conducting enamel layer.

11. The arrangement as set forth in claim 5, further comprising a cooling plate, flatly affixed to the flexible heat-conducting enamel layer.

12. The arrangement as set forth in claim 6, further comprising a cooling plate, flatly affixed to the flexible heat-conducting enamel layer.

13. A method for arranging an apparatus for dissipating heat from power components assembled on a printed-circuit board, comprising the steps of:
a) forming a printed-circuit board having a plurality of heat transfer bore holes distributed therethrough, the bore holes defining inner walls, and the printed-circuit board having a first side and a second side;
b) assembling power components on the first side of the printed-circuit board;
c) applying a heat-conducting material on the first side of the printed-circuit board in the area of the power components, on the inner walls of the bore holes, and on the second side of the printed-circuit board facing away from the power components;
d) applying an insulating enamel coating on the heat-conducting material on the second side of the printed-circuit board; and
e) applying a flexible heat-conducting enamel layer to the insulating enamel coating.

14. The method as set forth in claim 13, wherein the heat-conducting material includes copper.

15. The method as set forth in claim 13, further comprising the step of applying at least one additional flexible heat-conducting enamel layer to the insulating enamel coating.

16. The method as set forth in claim 14, further comprising the step of applying at least one additional flexible heat-conducting enamel layer to the insulating enamel coating.

* * * * *